July 9, 1968 P. YOUNG 3,392,330

INTERLOCK LOGIC NETWORK AND METHOD

Filed June 25, 1964 2 Sheets-Sheet 1

INVENTOR.
Patrick Young
BY [signature]
Attorneys

INVENTOR.
Patrick Young
BY [signature]
Attorneys

United States Patent Office 3,392,330

Patented July 9, 1968

3,392,330

INTERLOCK LOGIC NETWORK AND METHOD

Patrick Young, Oakland, Calif., assignor to W. K. Rosenberry, doing business as Zeta Research, Lafayette, Calif.

Filed June 25, 1964, Ser. No. 377,975
5 Claims. (Cl. 324—68)

ABSTRACT OF THE DISCLOSURE

Interlock logic network for use with time interval counters which prevents the measurement of negative time. Both coarse and fine negative time readings are prevented. The coarse negative time (stop before start time) is excluded in real time by conventional gating with the start pulse enabling the stop pulse. The fine negative time is excluded by the interlock logic network retroactively after the quantizing result is known. The retroactive exclusion of negative time permits interlock resolution to be the same as the apparatus resolution.

This invention relates to an interlock logic network and method and more particularly to an interlock logic network and method which excludes negative time and which can be used with time interval counters.

In making time interval measurements it is normally desirable to interlock or gate off the stop input channel until the start channel has first responded. This circuitry in a conventional time interval counter consists of a gate placed in the path of the stop channel. This gate is made active or in other words enabled when the start channel receives a signal. In order to achieve positive gating of the stop channel, the gating signal must have a rise time which is faster than the minimum time between the stop and start channels of the time interval counter, i.e., the minimum resolution of the time interval counter. If there is inadequate gating signal rise time, there will result a gate action which is dependent upon the stop signal amplitude. There is therefore a need for a new and improved interlock logic and method which will overcome the above named disadvantage.

In general, it is an object of the present invention to provide an interlock logic network and method which overcomes the above named disadvantages.

Another object of the invention is to provide an interlock logic network and method of the above character in which the gating resolution is comparable to the minimum resolution of the time interval counter without reliance upon fast rise time in the stop gate.

Another object of the invention is to provide an interlock logic network and method of the above character which also can be utilized with time interval counters and methods utilizing interpolation techniques for enhanced resolution.

Another object of the invention is to provide an interlock logic and method of the above character in which the direct gate signal rise time may be in order of magnitude slower than the resolution of the time interval counter without affecting the apparent gating resolution.

Additional objects and features of the invention will appear from the following description in which the preferred embodiment is shown in the accompanying drawing.

Referring to the drawing.

Figure 1:
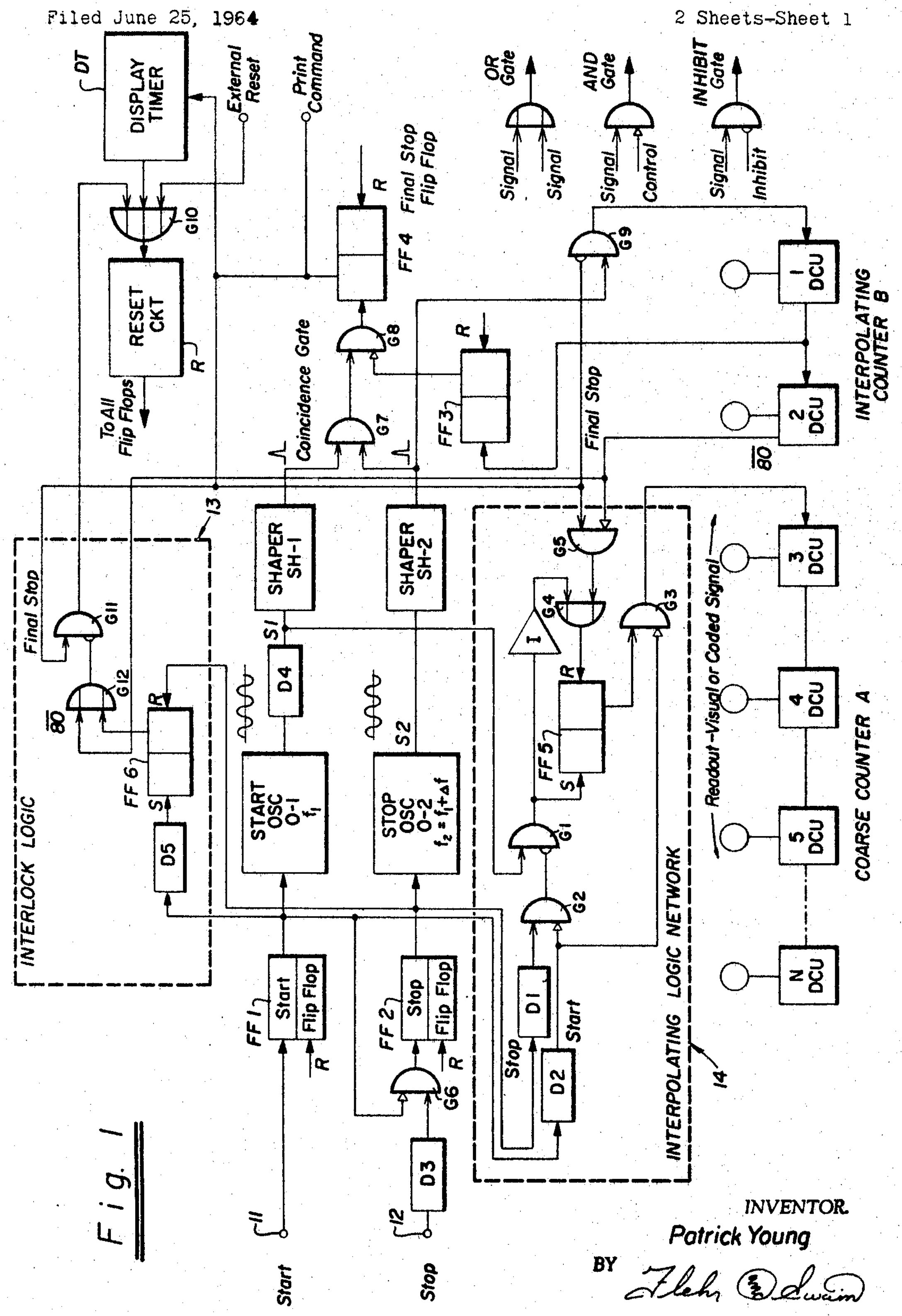
FIGURE 1 shows a circuit diagram in block form of an interlock logic network incorporating the present invention and used in conjunction with an interpolating time interval counter which is also shown in block form.

As shown in FIGURE 1 of the drawing, the interlock logic network 13 is shown within a broken line rectangle in the upper left-hand corner of the drawing and is incorporated as a part of an interpolating time interval counter of the type described in copending application Ser. No. 377,972, filed June 25, 1965. As explained in said copending application, start and stop commands are supplied to terminals 11 and 12. The start command is supplied to a start flip-flop FF1, whereas the stop command is supplied to a delay D3. The output of the delay D3 is connected to AND gate G6 which has its output connected to one side of a stop flip-flop FF2. The other input of the AND gate G6 is connected to one side of the start flip-flop FF1. The gate G6 is made active or enabled when a start command is received on the start channel.

As pointed out previously, the gating signal must have a rise time which is faster than the minimum time between the start and stop commands in order to achieve positive gating of the stop channel. If there is inadequate time for the gating signal to rise, the result will be a gate action which is dependent upon the amplitude of the stop signal. The interlock logic network 13 which forms the present invention is used for obtaining a gating resolution that is comparable to the minimum resolution of the time interval counter without relying on particularly fast rise times in the stop gate.

In general, the interlock logic network and method incorporating the present invention utilizes a combination of logical operations and direct gating to accomplish stop channel gating without the necessity of generating a fast gating signal.

As can be seen from the drawing, the interlock logic network consists of a flip-flop FF6. The start signal from the start flip-flop FF1 is supplied to one side (the set side) of the flip-flop FF6 through a delay D5. The stop signal from the stop flip-flop FF2 is supplied to the other side the reset side) of the flip-flop FF6. The reset side of the flip-flop FF6 is connected to one input of an OR gate G12. The other input of the OR gate G12 is connected to an interpolation counter B of the type described in copending application Ser. No. 377,972, filed June 25, 1964 which supplies a signal to the gate G12 when the interpolating counter is not over a predetermined number at the end of interpolation in the interpolation counter as, for example, any number including 79 and below which in computer language is identified as 80 not and written as $\overline{80}$ as indicated in the drawing. The $\overline{80}$ condition is readily indicated by the reset condition of the fourth flip-flop of the second decimal counting unit using 1–2–4–8 code. At the number 80 the fourth flip-flop switches to the set state.

The output of the OR gate G12 is connected to the inhibit terminal of inhibit gate G11. The other input terminal of the gate G11 is connected to a line which is supplied with a final stop signal when the counting operation has been finally completed as explained in copending application Ser. No. 377,972, filed June 25, 1964. The output of the inhibit gate G11 is connected to an OR gate G10 which supplies a signal to the reset circuit R for resetting the final stop flip-flop FF4.

Operation of the interlock logic in performing my method may now be briefly described as follows. For purposes of explanation, let it be assumed that the interpolation interval is 100 ns. (nanoseconds) in 1 ns. increments and that the delay introduced by the delay is D3 is 20 ns. With these assumptions, there are four possible relationships between the stop and start pulses. These relationships or conditions are identified below.

No. 1—stop command received long before (more than 20 ns.) the start command.

No. 2—stop command received 0 to 20 ns. before the start command.

No. 3—stop command received 0 to 20 ns. after receipt of start command.

No. 4—stop command received a long time (over 20 ns.) after receipt of start command.

In the first condition assumed above when the stop command is received long before the start command, the gate G6 is not enabled and, therefore, the stop command is not transmitted by the gate G6 to the stop flip-flop FF2. For this reason, no stop signal will be supplied to the interpolating time interval counter or the interlock logic 13. When the start command is received, the flip-flop FF1 will be triggered to its set condition to supply a signal to the start oscillator S1 to start the counting operation as described in copending application Ser. No. 377,972, filed June 25, 1964 but since the stop signal was rendered ineffective no measurement will be made. Thus, it can be said that the interlock logic in effect ignores the stop command which is received long before the start command.

For the second condition when the stop command arrives from between 0 to 20 ns. before the start command, the gate G6 will be enabled at the time that a stop signal arrives at the gate G6. The start command triggers the start flip-flop FF1 to supply a signal which enables the gate G6 before the stop pulse, after passing through the delay D3, arrives at the gate G6. The start flip-flop FF1 supplies a start signal to the start oscillator 0–1 to start its counting operation as described in copending application Ser. No. 377,972, filed June 25, 1964. The output signal from the start flip-flop FF1 is also supplied to the flip-flop FF6 which is normally in the reset state. However, since D5 introduces an additional delay which is greater than the delay by the delay D3, the stop signal from the flip-flop FF2 will arrive at the flip-flop FF6 before the start signal. By way of example, the delay D5 can introduce a delay of 50 ns. and the delay D3 can introduce a delay of 20 ns. Delay D5 is necessary to place the flip-flop FF6 in a unique state (set state) if the stop pulse comes with $\pm$ 20 ns. from the start pulse. Upon receipt of the stop pulse by the flip-flop FF6, flip-flop FF6 will not be flipped or triggered because the flip-flop is already in the reset state. The flip-flop FF6, however, will be flipped to its set state upon receipt of the start signal because the start signal is later than the stop signal. This causes the flip-flop FF6 to remove a signal from the gate G12.

As pointed out in copending application Ser. No. 377,972, filed June 25, 1964, the stop oscillator commences operation as soon as the stop signal is received and the interpolating counter B begins counting until coincidence is found by the gate G7 to cause the interpolating counter to be stopped at a number which represents the length of the time interval which has been measured after receipt of the stop signal. If the interpolating counter B reads a number which is 80 or greater, signal is not supplied to the gate G12. Since both signals to the OR gate are absent, no signal is applied to the inhibit terminal of gate G11, and hence the final stop signal generated by the final stop flip-flop FF4, as described in copending application Ser. No. 377,972, filed June 25, 1964, can pass through the gate G11 to the gate G10 to activate the reset circuit R and to thereby cause the complete instrument to be reset to its starting condition. In other words, the measurement which has just been made is cancelled because the interlock logic has given the information that the stop command was received before the start command, and, therefore, an erroneous measurement was made.

In the illustration given above, it has been assumed that the interpolating counter B is a 100 ns. interpolator which steps in 1 ns. steps. It is a cyclic interpolator which before 00 will read 99, 98, 97, etc. The delays which have been introduced by the delays D3 and D5 are such that if the interpolating counter B stops sooner than 20 ns. before start, it will be disabled by the gate G6. Thus, if there is a reading at all by the interpolating counter B, the reading of the interpolating counter B must fall somewhere beteen 80 and 99 ns. because any stop pulse coming sooner which would end in a reading of $\overline{80}$ would be gated off by gate G6 as explained under condition 1.

It should be pointed out that the figure of 20 ns. and the figure of only 80 ns. are somewhat arbitrary and that any other suitable number can be utilized. It is desirable to avoid a number which is too close to 50 or close to the center of the interpolating range because this might lead to an additional ambiguity.

For the third condition when the stop command is received from 0 to 20 ns. after the start command, the start command triggers the flip-flop FF1 and causes gate G6 to be enabled before the stop command arrives at the gate G6 because of the delay D3. Thus, it can be seen that a stop signal will be supplied by the flip-flop FF2 to the flip-flop FF6 before the start command is received because of the additional delay introduced by D5. Thus, flip-flop FF6 will again end up in a set condition and remove the signal to gate G12.

The start and stop signal supplied by the flip-flop FF1 and FF2 will cause the time interval being measured to be counted by the main counter A and the interpolating counter B described in copending application Ser. No. 377,972, filed June 25, 1964. However, in this case, the interpolating counter B will read a number between 0 and 20 because it has been assumed that the stop command arrives within 0 to 20 ns. after the receipt of the start command. Since this is $\overline{80}$, a signal is supplied to the $\overline{80}$ input of the gate G12 and the gate G12 supplies a signal to the inhibit terminal of gate G11. Therefore, a pulse will not be supplied to the reset circuit R when final stop is received. This, therefore, indicates that the reading which is made by the main counter A and the interpolating counter B is a correct one, that is, the stop command was received after the start command.

For the fourth condition in which the stop command comes long after the start command, that is, more than 20 ns. after the receipt of the start command, the gate G6 will be clearly enabled by the time that the stop command arrives at the gate G6 so that conventional operation of the time interval counter will take place. However, in this case, the start signal from the flip-flop FF1 supplied through the delay D5 will cause the flip-flop FF6 to be flipped to its set condition because the start signal is received by the flip-flop FF6 before the stop signal. The arrival of the stop signal for the flip-flop FF2 after the flip-flop FF6 has been triggered to its set condition causes the flip-flop FF6 to be again triggered to return it to its reset state to cause a signal to be supplied to the gate G12. The gate G12 supplies a signal to the inhibit terminal of gate G11. Thus, it can be seen if the interpolating counter B ends up at any number either below or above 80, a reset signal will not be sent to the reset circuit R because the gate G11 is already inhibited. The reading given by the time interval counter is, therefore, a correct reading.

From the foregoing, it can be seen that either signal supplied to the gate G12 can inhibit transmission of the final stop signal to the reset circuit. Enabling can only occur when both signals to the gate G12 are absent. This means one signal is not and the other signal is also not. Thus, it can be seen that the OR gate G12 with negation performs an "and" function. Under De Morgan's theorem, the OR gate with negation can be converted to an AND gate.

Figure 2:
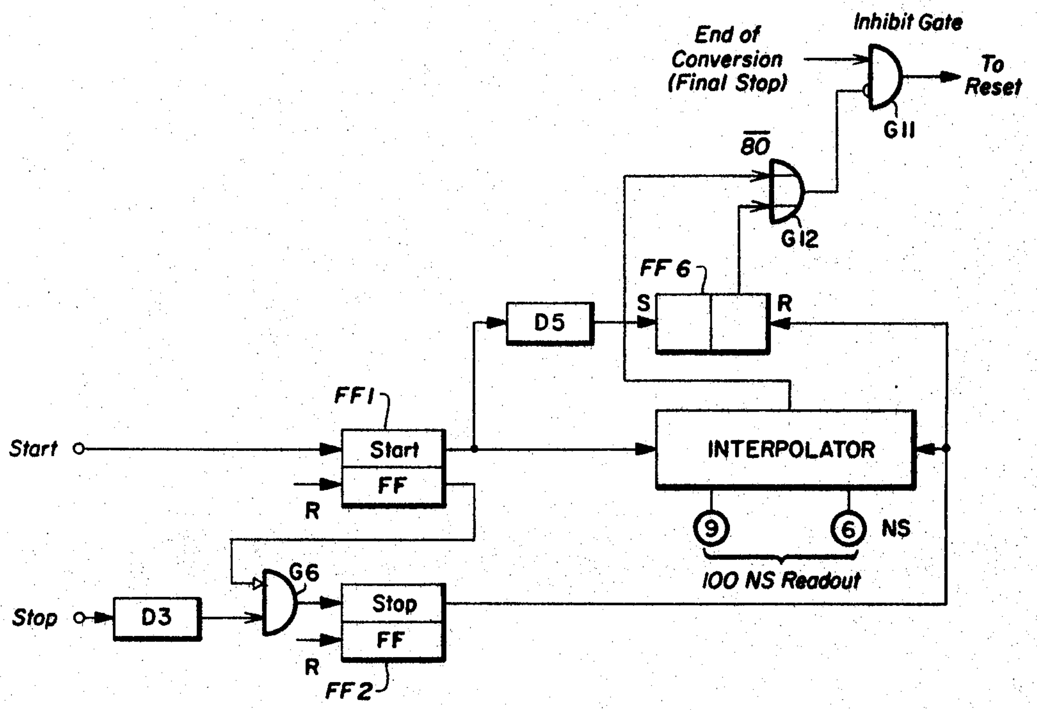
FIGURE 2 is a simplified block diagram of the interlock logic network shown in FIGURE 1.

A simplified arrangement of the interlock logic is shown in FIGURE 2 in which the main counter and associated apparatus has been eliminated and an interpolator has been substituted for the interpolating counter B. As in the arrangement shown in FIGURE 1, the stop channel is gated on before the time of the start pulse by the amount of the time delay D3 which, for example, can be assumed to be 20 ns. This can be called a "negative time" gating which is realized by inserting the delay D3 in advance of the stop gate G6. Thus, stop commands which arrive 20 or more ns. in advance of the start command will be directly gated off by the gate G6. A stop command that precedes the start command by less than 20 ns. will trigger the stop flip-flop FF2. The stop flip-flop FF2 then gates on the interpolator and at the same time pulses the reset input of the flip-flop FF6. The start flip-flop FF1 will pulse the set input of the flip-flop FF6 after a delay determined by the delay D5 which, for example, can be 50 ns. The delays of D3 and D5 are chosen so that the flip-flop FF6 will be (1) in the reset state if the stop command follows the start command by more than 20 ns.; (2) in the set state if the start command is separated by less than ±20 ns. from the stop command; and (3) in either state if the stop command is followed by the start command by more than 20 ns. In other words, the delay inserted by delay D5 should be sufficient to place the flip-flop FF6 in a unique state (set) if the stop pulse comes within a selected time range (±20 ns.) from the start pulse.

If the flip-flop FF6 is in the set state, the output of the interpolator is taken into consideration. As pointed out above, because of the cyclic nature of the interpolator, the output corresponding to negative time inputs (stop before start) will be regressive so that −1 ns., −2 ns., −3 nis., etc., will be read out as 99 ns., 98 ns. and 97 ns., respectively. Hence, if the output of the interpolator is 80 ns. or higher and the flip-flop FF6 is in the set state, the stop command must have arrived before the start command. In this case, the reading of the interpolator is reset to 0. It was reset to 0 because the reading is erroneous. If the output of the interpolator is truly 80 ns. or higher, the flip-flop FF6 is in the reset state.

From the foregoing, it can be seen that the stop channel is effectively interlocked and a reading cannot be made by a time interval counter when a stop command has in fact arrived before the start command. It is evident from the above that the direct gate signal rise time may be an order of magnitude slower than the resolution of the time interval counter without affecting the apparent gating resolution.

From the foregoing, it can be seen that the interlock logic network and method makes a decision as to the correctness of the reading made by the time interval counter after interpolation has been completed. This logic network and method is utilized to eliminate any ambiguity arising because of two closely spaced start and stop commands or pulses. Thus, it can be seen that if the stop pulse comes very close before or after the start pulse, slight negative times (stop before start) might read as a relatively large positive times as, for example, 99 ns., because of gating ambiguities. With the logic and method herein disclosed, the ambiguity may still occur but thereafter, the logic network and method is utilized to evaluate the relationship between the start and the stop command pulses and then, if necessary, to erase or reset before the reading before a display can be made. The interlock logic network and method utilized described above, in fact, cancels out any negative time counts. It should be appreciated that if desired, it is possible to display negative times but in the present arrangement, it has been chosen to set the instrument to 0 rather than to display a negative time. When the instrument is reset, this indicates that a positive time was not measured. As can be appreciated, the logic network can be readily modified so that when the interlock logic determines that a negative time has been measured, an appropriate display device can be provided which would display the complement of the number registered by the interpolator to thereby give a direct measure of the negative time measured.

I claim:

1. In an interlock logic for determining whether a stop signal arrived before a start signal, a bistable device having two stable states, means for introducing a predetermined time delay into the stop signal, means for supplying the start signal to one side of the bistable device, said means including time delay means for introducing a predetermined time delay which is greater than the predetermined time delay introduced into the stop signal, means for supplying the delayed stop signal to the other side of the flip-flop, interpolating means receiving the start and stop signals, means connected to said interpolating means and to one side of the bistable device for determining when said interpolating means has counted over a predetermined number and when said bistable device is in one of said states.

2. An interlock logic as in claim 1 wherein said means connected to said interpolating means and to one side of said bistable device includes at least one gate.

3. An interlock logic as in claim 1 wherein the means for introducing the start signal includes a bistable device and wherein the means for supplying the delayed stop signal includes a gate having two inputs and one output and a bistable device, one of the inputs of the gate being connected to one side of the bistable device in the means for introducing the start signal, the other of the inputs being connected to the delayed stop signal and the output being connected to the bistable device in the means for supplying the delayed stop signal.

4. An interlock logic as in claim 2 wherein the number representing the time delay inserted in the stop channel is a complement of the predetermined number at which the interpolator supplies a signal to the last named gate.

5. In an interlock logic for determining whether a stop signal arrives before a start signal, a bistable device having two stable states, a gate having two inputs and one output, means connecting the start signal to one input of the gate, means for introducing a predetermined time delay into the stop signal and for connecting the stop signal to the other input of the gate, an interpolator, means connecting the start signal to the interpolator and means for connecting the delayed stop signal from the output of the gate to the interpolator, means including means for inserting a predetermined time delay which is greater than the time delay introduced in the stop signal connecting the start signal to one side of the bistable device, means connecting the delayed stop signal from the output of the gate to the other side of the bistable device, gate means, means connecting the gate means to the side of the bistable device connected to the side to which the stop signal is supplied, and means connecting the interpolator to the gate means, and means connected to the said gate means for supplying a reset signal when a predetermined condition exists in the interpolator and said first named bistable device is in one of said stable states.

References Cited

UNITED STATES PATENTS

| | | | |
|---|---|---|---|
| 2,403,918 | 7/1946 | Grosdoff | 324—68 |
| 2,699,529 | 1/1955 | Wenk | 324—68 |

RUDOLPH V. ROLINEC, *Primary Examiner.*

WALTER L. CARLSON, *Examiner.*

S. B. GREEN, P. F. WILLE, *Assistant Examiners.*